United States Patent
Kumar et al.

[11] Patent Number: 6,078,173
[45] Date of Patent: Jun. 20, 2000

[54] SIMULTANEOUS SELF TEST OF MULTIPLE INVERTERS IN AN AC MOTOR SYSTEM

[75] Inventors: Ajith Kutrtqannair Kumar, Erie, Pa.; Kanwar Jit Singh, West Chester, Ohio

[73] Assignee: General Electric Company, Erie, Pa.

[21] Appl. No.: 08/629,327

[22] Filed: Apr. 8, 1996

[51] Int. Cl.[7] .................... G01R 31/02; G01R 31/42
[52] U.S. Cl. ............... 324/158.1; 324/73.1; 324/771
[58] Field of Search ................ 324/158.1, 765, 324/766, 73.1, 772, 771; 363/57, 58; 340/635, 645

[56] References Cited

U.S. PATENT DOCUMENTS

| | | | |
|---|---|---|---|
| 4,056,776 | 11/1977 | Olsson et al. | 324/766 |
| 4,392,175 | 7/1983 | Takigami et al. | 324/158.1 |
| 4,471,301 | 9/1984 | Durov et al. | 324/766 |
| 4,600,917 | 7/1986 | Seki et al. | 324/645 |
| 4,633,241 | 12/1986 | Casteel et al. | 324/645 |
| 4,659,983 | 4/1987 | Jacob | 324/158.1 |
| 4,674,023 | 6/1987 | Peppel et al. | 363/57 |
| 4,884,025 | 11/1989 | Hausler | 324/158.1 |
| 5,168,439 | 12/1992 | Kumar et al. | 363/95 |
| 5,223,821 | 6/1993 | Poe et al. | 324/765 |
| 5,262,691 | 11/1993 | Bailey et al. | 363/57 |
| 5,266,891 | 11/1993 | Kumar et al. | 324/765 |
| 5,363,039 | 11/1994 | Kumar et al. | 324/158.1 |

*Primary Examiner*—Ernest Karlsen
*Attorney, Agent, or Firm*—Jill M. Breedlove; Marvin Snyder

[57] ABSTRACT

A method for simultaneous testing of individual components in multiple three phase inverters, each connected to a common source of direct current electric power and being coupled to supply power to a respective one of a plurality of three phase loads, involves the steps of monitoring the voltage applied to the inverters and the current at each output phase terminal while gating each switching device in each inverter momentarily into conduction in sequence from a first switching device in a first phase to a last switching device in a third phase until an input voltage drop or an output current is detected. In response to a detected voltage drop, the sequence of gating is interrupted and advanced forward to the next occurring phase. If phase current is detected in any phase during gating, the inverter generating the current is disabled. The gating sequence is modified after detection of a voltage drop to initiate subsequent gating at a phase following the phase at which the voltage drop was detected to prevent inadvertent gating of short-circuited phases.

6 Claims, 3 Drawing Sheets

SIMULTANEOUS SELF TEST OF MULTIPLE INVERTERS IN AN AC MOTOR SYSTEM

BACKGROUND OF THE INVENTION

This invention relates generally to an apparatus and method for testing alternating current (AC) motor power systems and, more particularly, to an apparatus and method for simultaneous non-destructive in-circuit testing for short-circuit conditions of multiple inverters in an alternating current system.

It is common in AC electric motor drive systems to employ power inverter systems to furnish electric power from a DC source to an AC motor. These inverter systems are of various types, but are often comprised of gate turn-off thyristors (GTO) in a bridge arrangement. The GTOs in the bridge are selectively gated to control the electrical power supplied to the motor by converting DC power from the DC source into AC power which drives the motor. Typically, two GTOs are connected in a series arrangement in what is commonly referred to as a "leg" or "phase" between relatively positive and relatively negative busses of the DC source. A common inverter of this type is a three-phase inverter having three legs connected in parallel between the positive and negative DC source busses. The GTOs of each of the legs are rendered conductive in a predetermined order or sequence in order to control the electrical power delivered from the DC busses to the AC motor. In an exemplary application of such inverters such as, for example, in a locomotive electric drive system in which a diesel engine drives an alternator at variable speed to produce variable frequency electric power which is rectified before inversion to a controlled frequency power, the electric drive system can be reconfigured to use the inverter to drive the alternator for starting the diesel engine. This configuration is generally referred to as a "cranker" mode and uses the locomotive battery (typically about 75 volts) as the power source.

The above described motor systems require regular maintenance to avoid or detect a variety of common failure modes. For example, if both GTOs of a leg were to become conductive simultaneously, there would exist a short between the DC source busses which, if allowed to continue, could result in great damage to the motor, power source, and/or to the GTOs. In addition, failure of various components and segments of the system such as the feedback circuits, drive circuits, and the motor load itself can occur. U.S. Pat. No. 5,363,039, assigned to the assignee of the present invention, discloses a method and apparatus for auto self test of an inverter in an AC motor drive system. However, that patent does not address how to simultaneously test a plurality of inverters in a system, such as a locomotive, in which four, six or eight inverters may each be coupled to supply AC power to a corresponding AC motor driving a wheel-axle set of the locomotive. While the system of the '039 patent can self test each inverter, it is necessary to do so in a sequential format. With six inverters, 36 separate tests must be performed resulting in noticeable delay in bringing the locomotive to an operating condition. Accordingly, it is highly desirable to provide an auto self test capability which can simultaneously test each inverter in a multiple inverter system to identify short-circuit conditions in any of the inverters. In U.S. Pat. No. 5,363,039 the shorted module detection requires that the DC link be charged rapidly to a relatively high voltage. In a locomotive where the power circuit can only be charged slowly from an alternator or to a low level from a battery, that system is not satisfactory.

SUMMARY OF THE INVENTION

The above as well as other desirable features are achieved in accordance with the present invention by a testing protocol which allows simultaneous self test of multiple power inverters prior to enabling inverter operation. In an illustrative form, each power inverter in a plural inverter system has a plurality of legs, or phases, having first and second series connected controllable switching devices, such as GTOs, connected between positive and negative DC voltage busses. The testing method includes connecting a relatively low voltage source with limited current capacity (e.g., an alternator with limited field current, a battery with series resistance, a battery connected to the field of an alternator as in a cranker mode, or a charged capacitor voltage source) across the DC busses and thereafter momentarily gating each switching device in each inverter into conduction while monitoring the voltage across the DC bus. If the DC voltage collapses, indicating that one of the switching devices in one of the inverters is short-circuited, a control immediately transitions to another phase or leg of each inverter to continue testing. The identity of the particular phase that was being tested when the voltage drop was detected is stored in memory for each inverter and that phase is inhibited as the first phase to be tested in any subsequent testing. For example, if the initial testing sequence for an inverter is A, B, C, and if the voltage drop occurs during phase A testing, subsequent tests will start with the sequence B, C, A. The actual inverter in which a device is short-circuited is determined by measuring phase current at each output phase of each inverter as the self test continues. A similar concept with a different control algorithm and voltage and current limits can be used to self-test the inverter when configured into a cranker mode.

In an illustrative form, the present invention comprises a method for testing multiple power inverters in a motor power system in which each power inverter has at least three legs, or phases, connected between relatively positive and relatively negative voltage busses. Each inverter leg has a first and a second series connected controllable switching device, and each device has a parallel connected snubber circuit including a capacitor and diodes. The method comprises the steps of applying a relatively low voltage onto the DC busses and monitoring the voltage on the busses while momentarily gating a switching device in each inverter into conduction. Current in each phase is also monitored and if such current is detected, the associated inverter is locked out of operation. If there is a short in one of the other phases, for example, phase B, when one of the switches in phase A or phase C is turned on, current will build up slowly through the motor windings (limited by the load inductance). This build up of current is used to detect a short in the other phase. If a voltage drop is detected on the voltage busses, the gating signals are rapidly removed from the current phase and re-applied to the next sequential phase after a brief period sufficient to recharge the DC link voltage. By using a low testing voltage with limited current sourcing capability and removing gating signals in response to a voltage drop, damage to the system is minimized even though a short circuit condition exists.

BRIEF DESCRIPTION OF THE DRAWINGS

The invention, together with further objects and advantages thereof may be understood by reference to the following description taken in conjunction with the accompanying drawings in which.

DETAILED DESCRIPTION OF THE INVENTION

Figure 1:
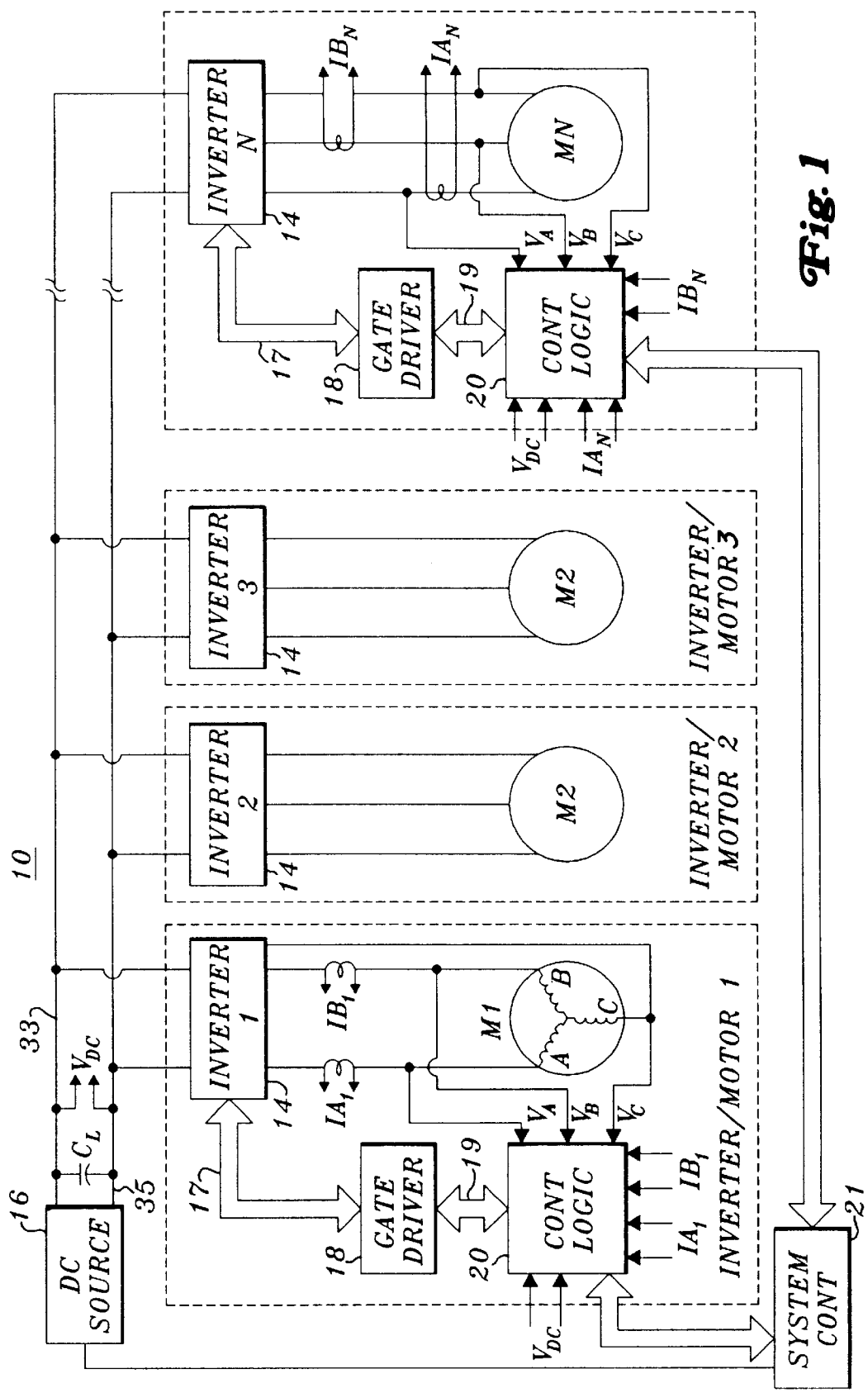
FIG. 1 is a generalized block diagram illustrating an AC motor drive system.

FIG. 1 is a block diagram of a specific embodiment of a three-phase, voltage source inverter driven motor system 10 with which the present invention may be used. System 10 is illustrated as including a plurality of three-phase AC motors M1–MN driven by a corresponding one of a plurality of three-phase voltage source inverters 14 supplied by a DC power source 16. It will be recognized that the invention is applicable to a wide range of power converter-load configurations, such as, for example, transformer loads and other inductive or resistive loads. Coupled to each inverter 14 is a corresponding one of a plurality of gate driver modules 18, each of which is controlled by a respective control logic circuit 20. In operation, the inverters 14 convert the DC power from DC source 16 into three-phase excitation voltage for application to respective phase windings A, B and C of motors M in response to gate drive signals from gate driver modules 18. The gate driver modules 18 provide gating signals over link 17 to enable switching of the inverter switching devices (e.g., GTOs) in the inverters 14. Each of the modules 18 is controlled by the respective control logic circuit 20 via optical control links 19. In addition, feedback status signals from the GTO devices of each inverter 14 are coupled back to the associated gate driver module 18 and its control logic circuit 20 via the links 17 and 19. Additional signals from current and voltage sensors of the inverters' outputs are coupled to each control logic circuit 20 as shown. The control logic circuits 20 use the feedback values and the sensed current and voltage values to perform the auto self test method in accordance with the invention. A system controller 21 provides signals to logic circuits 20 to enable self test or normal operation of the inverters. The system controller 21 also signals the DC source 16 to apply reduced voltage on the DC busses during self test.

Figure 2:
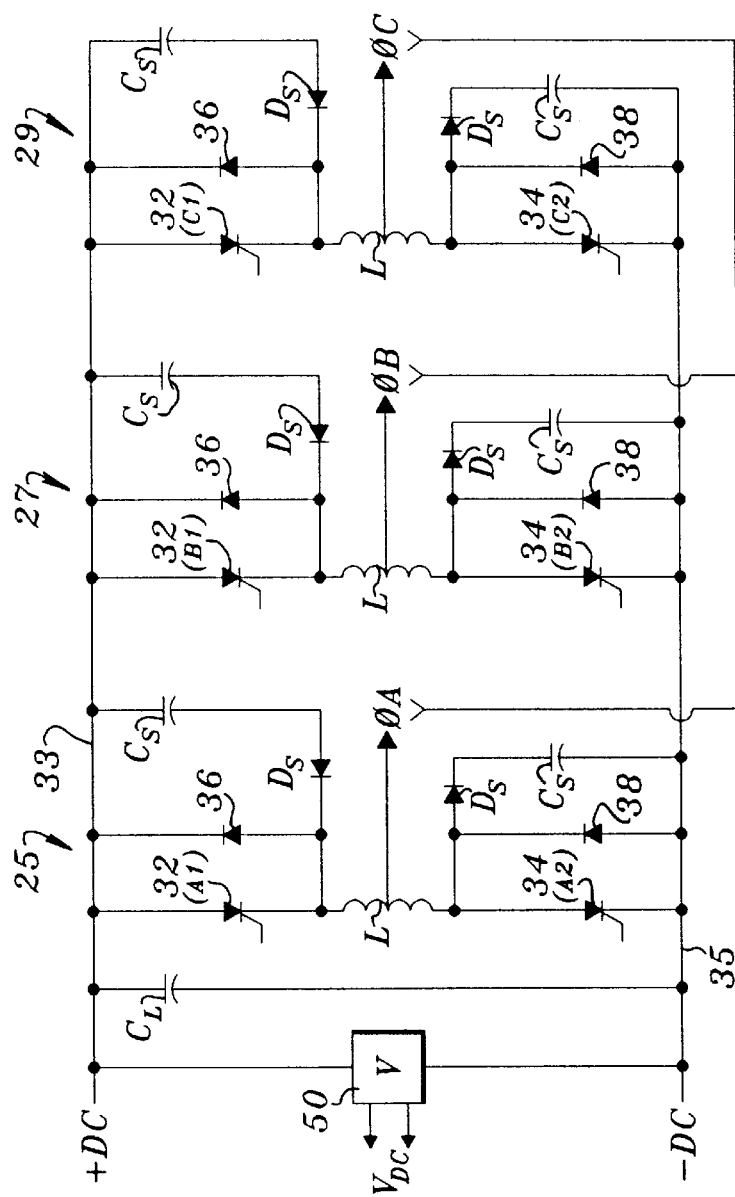
FIG. 2 is a detailed block diagram of the power inverter circuit shown in FIG. 1.

Referring now to FIG. 2, there is shown a simplified schematic diagram of one of the three-phase inverters 14. A more detailed illustration of an embodiment of inverters 14 and their associated gate driver circuits 18 is set forth in U.S. Pat. Nos. 5,262,691 and 5,363,039, both assigned to General Electric Co. and incorporated by reference herein. The inverter 14 comprises a first leg 25 (phase A), a second leg 27 (phase B), and a third leg 29 (Phase C), each having an upper GTO 32 and a lower GTO 34 arranged in series through a center-tapped di/dt reactor L with the anode of the upper GTO 32 coupled to a positive DC source bus 33 and the cathode of the lower GTO 34 coupled to a negative DC source bus 35. The GTOs 32, 34 may typically be mounted on a heat sink with a temperature sensing thermal resistor (not shown) mounted thereon to detect overheating.

For each GTO 32, 34, there is a respective anti-parallel diode 36, 38 connected from anode to cathode to provide a return path for inductive load currents. Each GTO is also shunted by a snubber circuit comprising a capacitor Cs and a diode Ds which assists in reducing switching transients. Current measurement circuit 44 and 46, each of which may be a Model LT1000-FI/SP45 manufactured by LEM of Switzerland, are connected to monitor current at the inverter output. Since net current $I_A+I_B+I_C$ equals zero, one phase current can be calculated from measured values of two of the phases. Each output phase is coupled to a corresponding phase terminal of the three-phase motor 12. A conventional high impedance voltage measurement circuit 50 is connected between the DC busses 33 and 35. The current measurement circuits 44 and 46 generate current measurement signals $I_A$ and $I_B$ which are coupled to the control logic circuit 20 (FIG. 1). The voltage measurement circuit 50 generates a voltage measurement signal $V_{DC}$ which is coupled to the control logic circuit 20. Additionally, the phase voltages $V_A$, $V_B$, $V_C$ with respect to DC negative are monitored by circuit 20.

Each gate driver circuit 18 is coupled to the gate and cathode of each respective GTO 32, 34 and provide drive signals to the gates of the GTOs to turn them on and off at the proper time. The gate drivers also detect whether the GTO actually did turn on or off in response to the drive signals (i.e., gate status feedback). In addition, each gate driver 18 is coupled to its associated control logic circuit 20 via conventional optical couplers to permit input of gate command signals from the control logic circuit 20 and to send gate status feedback signals indicating whether the GTO is turned on or off, back to the control logic circuit 20.

A detailed description of an exemplary control logic circuit 20 is provided in U.S. Pat. No. 5,168,439 entitled "Inverter Control Method and Apparatus" issued Dec. 1, 1992, assigned to General Electric Company and incorporated by reference herein. The operation of logic circuit 20 in conjunction with inverter 14 and gate driver 18 is set forth in the aforementioned U.S. Pat No. 5,363,039.

In normal operation, the control logic circuit 20 generates gate command signals which are coupled to the gate driver module 18. A microprocessor controls generation of gate firing pulses by providing gate firing control signals. The gate driver module 18 generates gate firing control pulses in response to the gate firing control signals. The GTOs of the inverter 14 are then turned on and off by the gate driver module 18 at the appropriate times under the control of the gate firing pulses (gating signals). Additionally, gate status feedback signals are coupled to the logic circuit 20 which utilizes them to determine if the GTOs actually switched, as commanded, in order to prevent unwanted conditions such as having both upper and lower GTOs turned on at the same time.

Auto self test of the inverters can be performed with the motors M1–MN stopped or rotating, i.e., an "on-the-fly" test. However, if testing occurs while the motors are rotating, the inverters must first be gated out of conduction for a time period sufficient to allow motor flux to decay to zero. Such a time period is a function of the motor time constant but for a typical AC traction motor is about 1 or 2 seconds. During self-test, the GTOs are turned on and off under control of the control logic circuit 20 using the method according to the invention. The circuit 20 (using its microprocessor) then analyzes the voltages and currents measured during the test sequence and generates appropriate error messages if an abnormality is detected.

Prior art multiple inverter systems have required that inverters be tested sequentially using test protocols such as that shown in U.S. Pat. No. 5,363,039. Typically, the system controller commands each individual control logic module 20 to implement testing of its associated inverter. After each module 20 reports the results of its testing to the system controller, the controller commands the next module 20 to test its associated inverter.

In the present invention, the system controller commands each module 20 to conduct testing concurrently. However, since each inverter is connected in parallel to the DC bus, a short-circuited switching device in any one inverter will cause the DC bus voltage across all inverters to drop. Consequently, each module 20 will report a failure of its associated inverter. Since the system cannot distinguish which inverter has a short and since the tests are asynchronous between inverters, the results are both misleading and inconsistent. Moreover, other concurrent tests of inverter voltage and current will be incorrect due to collapse of the link voltage. Advantageously, therefore, in order to identify which inverter has actually failed, the logic module 20 checks for current flow in the motor windings. For example, if GTO device A1 is gated into conduction and device B2 is shorted, current will flow from the positive DC bus, through device A1, motor windings A and B, and device B2 to the negative DC bus. Thus, if a relatively large current, i.e., larger than normal snubber circuit current, is detected in the motor windings when one device is gated into conduction, then another device is shorted and the inverter must be disabled. Note that if device A2 is shorted, when device A1 is gated into conduction, a short-circuit will exist across the DC busses and the bus voltage will collapse. The device A1 is quickly gated out of conduction before current can build-up in order to protect device A1 and other components in the system and to continue with the remainder of testing of the other inverters. Inductance in the power source limits the rate of current build-up.

If device A2 is shorted when device A1 is gated into conduction, the device A1 is quickly gated off and the logic module 20 skips to the next phase; i.e., no attempt is made to gate the device A2 into conduction. This process is utilized regardless of which phase is being tested when a bus voltage collapse is detected. For example, if the second inverter is in the process of testing phase B (device B1 or B2 gated into conduction) at the time that the voltage collapses, the module 20 associated with the second inverter will immediately stop phase B testing and increment forward to phase C. Since each inverter is tested independently, although concurrently, the particular switching device being tested at each inverter will vary depending on individual response time; i.e., testing is concurrent but may be asynchronous. Each module 20 stores the identity of the phase being tested whenever a voltage collapse occurs and thereafter starts testing at the next occurring phase. Note that if one of the modules detects a shorted device in its associated inverter, the module stops all subsequent tests. However, if the module stops the tests due to a link voltage collapse, it will restart the tests after the link is re-established with the next phase and will finish all three phase tests. For example, if the initial test began with phase A and the link voltage collapsed during phase A testing, all subsequent testing follows the phase sequence BCA; i.e., a complete test is performed but the starting sequence is changed after a collapse. This minimizes the risk of overcurrent damage in the event the system is reset without clearing the fault condition and also minimizes the risk of DC link collapse which would increase test time.

Figure 3:
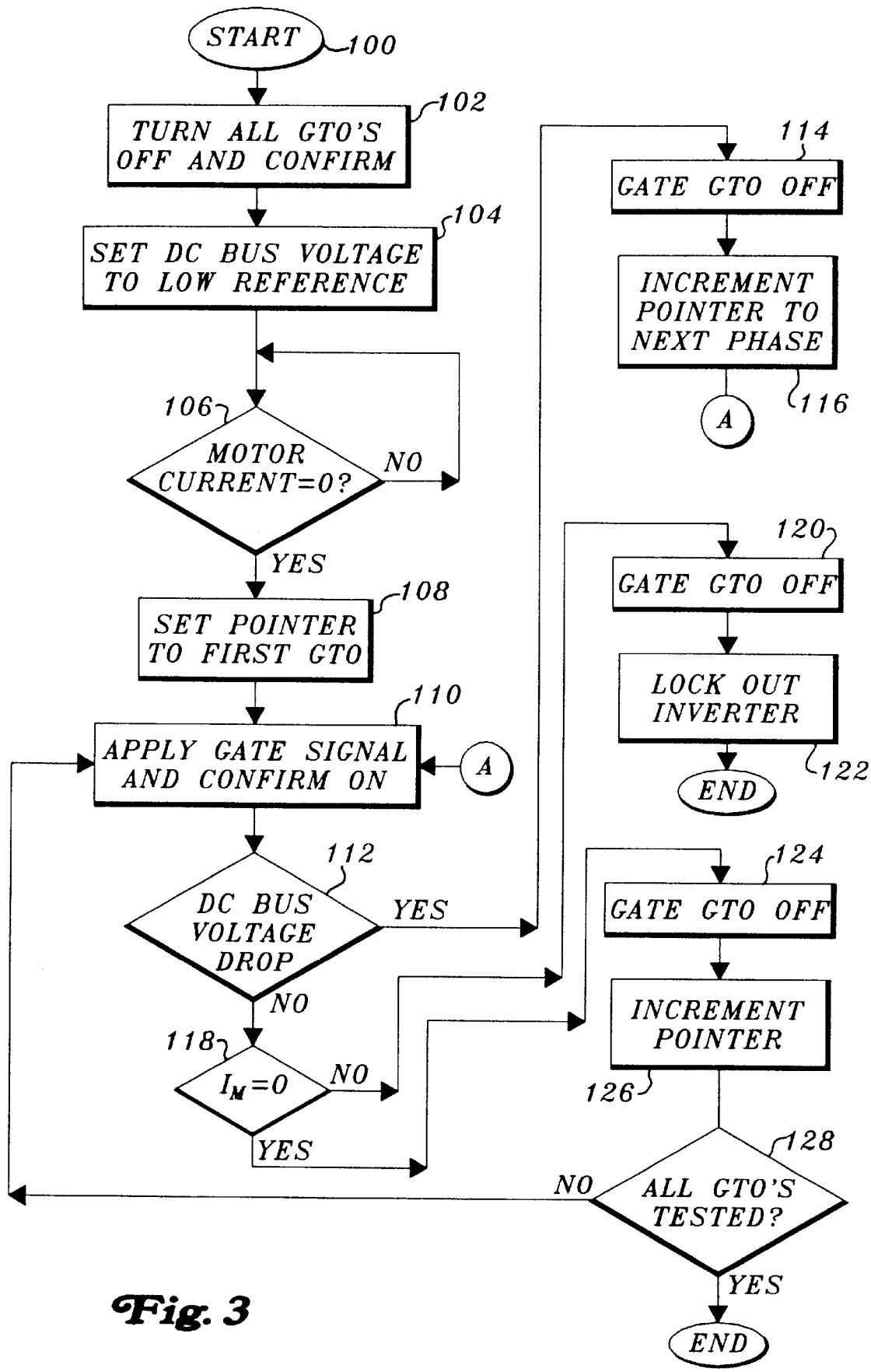
FIG. 3 is a detailed block diagram of the control logic shown in FIG. 1.

FIG. 3 illustrates the test routine for each individual inverter. It will be understood that this routine is carried out concurrently by each module 20 although the particular GTO device identified as the "first" device may be different in each inverter.

Referring to FIG. 3, the test routine is entered at block 100, as shown, and begins with the turnoff of all GTOs, as illustrated by block 102. Off commands are sent to all six GTOs (See FIG. 2) and those commands are verified to be off by checking the gate command signals which are output from the gate driver 18 and fed back to the control logic 20. The DC bus voltage is then set to a low reference value, e.g., 100 volts, selected to prevent damage to the system in the event there is a shorted switching device, as illustrated in block 104. The currents in each motor phase are then checked after a short delay to allow snubber circuit currents to die out (e.g., 1 millisecond) to determine if they are zero, as illustrated by block 106. The current check is performed by checking the values of IA and IB and computed IC. After a small delay (e.g., 100 microseconds) after the current check, the gate status feedback signals are checked to verify that all GTOs are off. If motor current is not zero, the program cycles to allow current to decay.

The logic module 20 selects the first switching device, e.g., GTO 32, to gate into conduction (block 108) and generates a gate pulse signal to apply to the device (block 110). The module 20 confirms conduction of the device and monitors the bus voltage, as illustrated in block 112. If the bus voltage drops, the device is immediately gated out of conduction (block 114) and module 20 increments to the next phase (block 116). As used in FIG. 3, the module 20 increments a pointer in its microprocessor program to step from device to device or phase to phase. As described in the aforementioned '039 patent, each module 20 includes a microprocessor and associated computer modules (registers, memory, etc.) to enable it to run test programs and to store and retrieve test results. After incrementing a pointer to a next phase, the program cycles back to block 110 to apply gating signals to a next device.

If the DC bus voltage does not collapse when a particular device is gated into conduction, the program steps to block 118 and checks for motor current. If current is detected, a shorted device exists in the inverter and the gated device is then gated off (block 120), and the inverter locked out or disabled (block 122). If current is not detected, the device is gated off (block 124), the pointer is incremented (block 126), and the program checks to determine if all devices have been tested (block 128). If testing is not complete, the program cycles to block 110 and tests the next device.

The present invention provides a method for concurrent but not necessarily synchronous testing of multiple inverters coupled in parallel to a common DC bus. Synchronous testing would require that all the controllers modules 20 communicate to each other which is a disadvantage.

Figure 4:
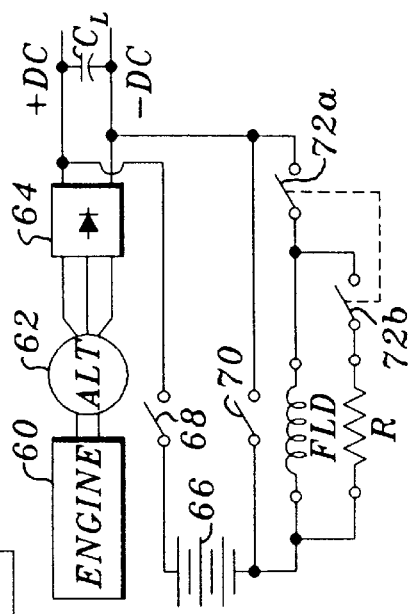
FIG. 4 is a simplified schematic representation of a diesel engine/alternator arrangement with which the present invention may be used.

One aspect of the invention involves testing at a reduced voltage which is implemented by using battery voltage or by controlling the supply voltage. For example, referring to FIG. 4, a conventional locomotive utilizes a diesel engine 60 to drive an alternator 62 to provide electrical power. The alternator output is applied to a bridge rectifier 64 which converts 3-Ø AC to DC. An on-board battery 66 is used to crank engine 60 and also to provide power to jog the locomotive for short moves. This battery source is used to provide a charged DC link (using the DC link capacitors $C_L$) by closing contactors 68 and 70 and then opening the contactors when the link is charged. In the cranking configuration, contactors 68, 72$a$ and 72$b$ are closed which connects a combination of a resistance R and alternator field winding FLD in series with the battery 66 to limit field current. During testing, the rectifier 64 is not in conduction and switch 68 is closed to provide battery voltage on the DC bus. Use of the battery for self-testing is particularly useful under shop conditions when the locomotive cannot be operated. It is also possible to control the alternator 62 to generate lower voltage or to phase control the rectifier 64 to reduce its voltage output. A similar procedure is used to test the inverters when connected in a cranker configuration with the alternator as the load.

Another aspect of the invention is the concurrent testing and the monitoring of bus voltage to detect a short switching device. In conjunction with this aspect is the ability to store the identity of the phase at which voltage collapse occurred so that future testing avoids that phase initially to minimize risk of damage on an inadvertent reset and minimize stress on re-test and time before re-test.

Specific embodiments of the novel method and apparatus for auto self test of an AC motor system have been described for the purpose of illustrating the manner in which the invention may be made and used. It should be understood that implementation of other variations and modifications of the invention in its various aspects will be apparent to those skilled in the art and that the invention is not limited by specific embodiments described. It is therefore contemplated to cover by the present invention any and all modifications, variations or equivalents that fall within the true spirit and scope of the underlying principals disclosed and claimed herein.

What is claimed is:

1. A method for simultaneously testing a plurality of inverters for failure of individual components said inverters being connected to a common source of direct current electric power, each of the inverters comprising at least three phases with each phase comprising at least two switching devices serially connected between a relatively positive voltage bus and a relatively negative voltage bus, each of the inverters being coupled to supply power to a respective one of a plurality of three phase loads via a connection from respective junctions mediate each pair of switching devices to a corresponding phase terminal of the respective load, comprising simultaneously testing said plurality of inverters by:

monitoring voltage between the positive and negative voltage busses and monitoring current at each phase terminal of each load;

gating each switching device in each inverter momentarily into conduction in sequence from a first switching device in a first phase to a second switching device in a third phase until detection of a voltage drop or a load current;

interrupting, in response to a detected voltage drop, the sequence of gating and advancing the step of gating to the next occurring phase; and inhibiting operation of any inverter in which phase current is detected in any phase during the step of gating.

2. The method of claim 1 and including the step of applying a relatively low voltage onto the positive voltage bus to limit current under short circuit conditions.

3. The method of claim 1 and including the step of modifying the step of gating upon detection of a voltage drop to initiate subsequent gating steps at a phase following the phase at which the voltage drop was detected.

4. The method of claim 1 and including the step of monitoring voltage at each inverter output for detecting switching device failure.

5. The method of claim 1 and including the step of inhibiting starting of subsequent inverter testing at any inverter phase at which a voltage drop was detected during a previous testing.

6. The method of claim 1 wherein the three phase loads each comprise a three phase induction motor connected in driving relationship to respective wheel-axle sets of a locomotive and wherein the method is practiced while the locomotive is moving, and including the initial step of removing electric power from the motors for a time sufficient to permit motor flux to collapse to substantially zero prior to testing of the inverters.

* * * * *